United States Patent
L'Huillier et al.

(10) Patent No.: US 10,139,565 B2
(45) Date of Patent: Nov. 27, 2018

(54) END-FACE COATING OF A WAVEGUIDE

(71) Applicant: ROSENBERGER-OSI GMBH & CO. OHG, Augsburg (DE)

(72) Inventors: Johannes Albert L'Huillier, Altleiningen (DE); Benjamin Weigand, Kaiserslautern (DE); Christian Theobald, Augsburg (DE)

(73) Assignee: Rosenberger-OSI GmbH & Co. OHG, Augsburg (DE)

( * ) Notice: Subject to any disclaimer, the term of this patent is extended or adjusted under 35 U.S.C. 154(b) by 0 days.

(21) Appl. No.: 15/315,910

(22) PCT Filed: May 26, 2015

(86) PCT No.: PCT/EP2015/001076
§ 371 (c)(1),
(2) Date: Dec. 2, 2016

(87) PCT Pub. No.: WO2015/185194
PCT Pub. Date: Dec. 10, 2015

(65) Prior Publication Data
US 2017/0123157 A1    May 4, 2017

(30) Foreign Application Priority Data
Jun. 5, 2014 (DE) .................. 10 2014 008 369

(51) Int. Cl.
*G02B 6/26* (2006.01)
*G02B 1/10* (2015.01)
(Continued)

(52) U.S. Cl.
CPC ............... *G02B 6/262* (2013.01); *G02B 1/04* (2013.01); *G02B 1/111* (2013.01); *G02B 1/12* (2013.01);
(Continued)

(58) Field of Classification Search
None
See application file for complete search history.

(56) References Cited

U.S. PATENT DOCUMENTS 5,246,782 A    9/1993  Kennedy et al.
5,255,089 A *  10/1993 Dybas .................... H04N 7/183
                                                    250/574
(Continued)

FOREIGN PATENT DOCUMENTS

DE    102007009512    8/2008
DE    102008018866    10/2009
(Continued)

OTHER PUBLICATIONS

"Black silicon", Wikipedia, 6 pages.
(Continued)

*Primary Examiner* — Michelle R Connelly
(74) *Attorney, Agent, or Firm* — DeLio, Peterson & Curcio, LLC; Robert Curcio

(57) ABSTRACT

A waveguide, such as an optical fiber, having a front face, such as a fiber facet, is provided with a coating. The coating having one or more organic fluorine compounds. The invention also concerns a method for producing this type of waveguide by means of plasma polymerization.

19 Claims, 1 Drawing Sheet

(51) Int. Cl.
  *G02B 1/12* (2006.01)
  *G02B 6/02* (2006.01)
  *G02B 27/00* (2006.01)
  *G02B 1/18* (2015.01)
  *G02B 1/111* (2015.01)
  *G02B 1/14* (2015.01)
  *G02B 1/04* (2006.01)
  *H01J 37/32* (2006.01)
  *G02B 1/118* (2015.01)

(52) U.S. Cl.
  CPC ............... *G02B 1/14* (2015.01); *G02B 1/18* (2015.01); *G02B 6/02* (2013.01); *G02B 27/0006* (2013.01); *H01J 37/32009* (2013.01); *G02B 1/118* (2013.01); *H01J 2237/334* (2013.01)

(56) References Cited

U.S. PATENT DOCUMENTS

| | | | | |
|---|---|---|---|---|
| 5,345,545 A * | 9/1994 | Uemiya | ............... | B82Y 30/00 359/332 |
| 5,409,777 A * | 4/1995 | Kennedy | ............... | C08J 5/04 428/34.4 |
| 5,859,937 A * | 1/1999 | Nomura | ............... | G01N 21/7703 385/12 |
| 5,991,081 A | 11/1999 | Haaland et al. | | |
| 6,488,414 B1 * | 12/2002 | Dawes | ............... | G02B 6/241 385/141 |
| 7,195,872 B2 * | 3/2007 | Agrawal | ............... | B01J 19/0046 422/503 |
| 8,008,068 B2 * | 8/2011 | Nomura | ............... | G01N 33/528 356/450 |
| 8,568,878 B2 * | 10/2013 | Wilson | ............... | B22F 1/0018 356/301 |
| 9,558,920 B2 * | 1/2017 | Sanghera | ............... | G02B 6/262 |
| 2009/0252649 A1 * | 10/2009 | Nomura | ............... | C08J 7/047 422/52 |
| 2011/0097755 A1 * | 4/2011 | Nomura | ............... | G01N 33/528 435/14 |
| 2015/0369744 A1 * | 12/2015 | Yang | ............... | B82Y 40/00 356/301 |

FOREIGN PATENT DOCUMENTS

| | | |
|---|---|---|
| EP | 2267501 A2 | 12/2010 |
| JP | 2000290396 | 10/2000 |
| JP | 2003294901 | 10/2003 |
| WO | WO 2011053859 A1 | 5/2011 |

OTHER PUBLICATIONS

"Reactive-ion etching", Wikipedia, 2 pages.

E. Vanderlinde, C. J. Von Benken, C. M. Davin, A. R. Crockett, "Fast, Clean and Low Damage Deprocessing Using Inductively Coupled and RIE Plasmas"; Proceedings of the 22nd International Symposium for Testing and Failure Analysis, Nov. 18-22, 1996, Los Angeles, California.

E. Vanderlinde, C. J. Von Benken, A. R. Crockett, "Rapid integrated circuit delayering without grass", Proceedings SPIE—The International Society of Optical Engineering, vol. 2874, S. 260-271, 1996.

M. Stubenrauch, M. Fisher, C. Kremin, S. Stoebenau, A. Albrecht, O. Nagel, Black silicon—New Functionalities in Microsystems, Journel of Micromechanics and Microengineering, May 9, 2006, pp. S82-S89.

Vanderlinde, William E., Von Benken, Christopher J, & Crockett, Addison R., "Rapid Integrated Circuit Delayering Without Grass", Article in Proceedings of SPIE—The International Society for Optical Engineering • vol. 2874, p. 260-271, Sep. 1996.

* cited by examiner

END-FACE COATING OF A WAVEGUIDE

BACKGROUND OF THE INVENTION

1. Field of the Invention

The invention relates to a waveguide, and in particular to an optical waveguide such as an optical fiber, the waveguide having a front face provided with a coating.

2. Description of Related Art

A waveguide such as an optical fiber may be intended to conduct light in the UV range, in the visible range and/or in the IR range. Waveguides usually have a front face through which the light emerges from the waveguide and/or enters the waveguide. The front face may be in contact with its environment at least at times and is therefore particularly prone to fouling. If the front end of the waveguide has been inserted in an insertion-type connector for light guides, the front face may also be subject to mechanical loads due to insertion processes, in which case the front face often has to withstand several hundreds to thousands of insertion cycles while it is in use.

Fouling or damage to the front face may result in a decrease in its permeability to light and hence in a degradation of the transmission properties of the waveguide as a whole. In extreme cases the waveguide becomes unusable when there is fouling to its front face.

It is already known for front faces of waveguides to be provided with coatings such as anti-reflection coatings (AR coatings) in order to increase the passage of light through the front face, i.e., to reduce reflections. However, it has been found that, even with coatings of this kind, the mechanical properties of waveguide front faces, and their resistance to fouling, are usually inadequate.

SUMMARY OF THE INVENTION

In view of the problems described, it is the object of the present invention to provide a waveguide having a coated front face, the latter of which ensures reliably high transmission properties over a long period in use; the waveguide thus being able to be used as a durably maintenance-free component.

This object is achieved in accordance with the invention by a waveguide as claimed in independent claims. Advantageous refinements of the invention are described in the dependent claims.

The above and other objects, which will be apparent to those skilled in the art, are achieved in the present invention which is directed to an optical waveguide having a front face provided with a coating, the coating comprising one or more organic fluorine compounds, wherein the front face of the optical waveguide and/or an outer face of the coating is structured by a plasma and/or etching treatment. The coating may comprise octafluorocyclobutane (OFCB) and/or products of the polymerization of OFCB. The coating may also comprise benzene and/or products of the polymerization of benzene.

Furthermore, the coating may comprise a layer of PP-OFCB and PP-benzene mixed in a preset ratio. The mixing ratio may be set in such a way that the refractive index of the layer is matched to the refractive index of a material of the waveguide, the refractive index of the layer being approximately n=1.45.

Moreover, the coating may comprise alternating layers of plasma polymerized OFCB (PP-OFCB) and plasma polymerized benzene (PP-benzene).

In at least one embodiment, the front face of the optical waveguide and/or the outer face of the coating is structured to a depth of between 1 nm and 100 nm, or between 1 nm and 10 nm.

The front face may be a fiber facet.

In a second aspect, the present invention is directed to a method of producing a waveguide having a front face, the method comprising: coating the front face with a coating comprising organic fluorine compounds by plasma polymerization, using OFCB as a precursor; and structuring the front face of the waveguide and/or an outer face of the coating by a plasma and/or etching treatment. The plasma polymerization, OFCB and benzene may be used simultaneously or alternately as precursors, the front face thus being coated with plasma polymerized OFCB (PP-OFCB) and plasma polymerized benzene (PP-benzene) simultaneously or alternately.

In at least one embodiment, the front face of the waveguide and/or the outer face of the coating is structured by treatment with an oxygen plasma.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 1:
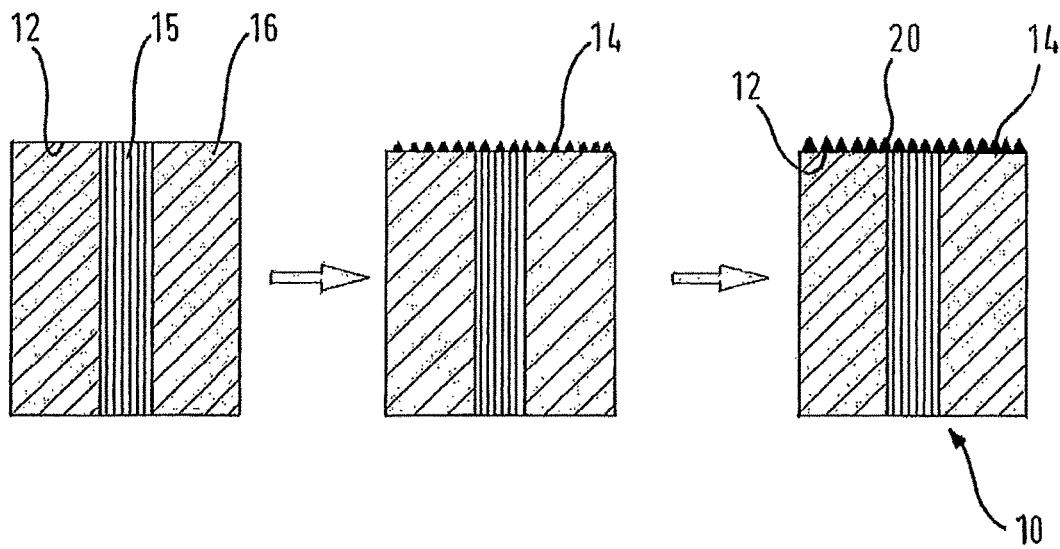
FIG. 1 shows, in schematic views, a method of producing a waveguide according to the invention in three steps.

In describing the preferred embodiment of the present invention, reference will be made herein to FIGS. 1-2 of the drawings in which like numerals refer to like features of the invention.

The waveguide according to the invention has a front face which is provided with a coating comprising one or more organic fluorine compounds. The coating preferably comprises octafluorocyclobutane (OFCB, $C_4F_8$) and/or products of the polymerization of OFCB and in particular plasma-polymerized OFCB (PP-OFCB). As a particular preference, at least one layer of the coating, or the entire coating, (apart from impurities) is composed substantially exclusively of PP-OFCB. In other words, the front face of the waveguide preferably has a covering film of PP-OFCB. What is meant by plasma-polymerized OFCB (PP-OFCB) are plasma polymers (and in particular organic fluorine compounds such as fluorocarbons, etc.) which are grown or deposited on the front face of the waveguide by plasma polymerization, using OFCB as a precursor.

The invention originates from appreciation of the fact that conventional coatings of waveguide front faces are not sufficiently dirt-repellent, thus enabling such things as dust, liquids, oils, etc. to collect on the front face over the course of the use of the waveguide and to detract from its transmission properties. Organic fluorine compounds, and in particular films of PP-OFCB, have hydrophobic and oleophobic properties, thus enabling any such accumulation of unwanted substances on the front face to be reliably prevented and enabling the period in operation of the waveguide to be increased by coating with PP-OFCB, or in other words the interval between individual cleaning operations to be lengthened.

Trials have shown that, given its similar properties to Teflon (polytetrafluoroethylene, $C_2F_4$), PP-OFCB can be used as a barrier to permeation which, for very long periods, is able to withstand being flooded with distilled water, acetone, isopropanol, highly wetting polysorbate and also other substances. A front face of a waveguide which is provided with a coating of PP-OFCB is thus able to be cleaned repeatedly with, for example, acetone or other cleaning agents without any fear of mechanical or other damage to the coating.

Added to this is the fact that PP-OFCB comprising organic fluorine compounds is also suitable as a coating material in respect of the optical properties required. In this way, a PP-OFCB film is notable for low absorption of electromagnetic radiation in the near-infrared bands, which are important for data communications, but also, and particularly, in the range from 400 nm to 700 nm.

What is more, PP-OCFB is able to be applied in a controlled way to a waveguide front face, which may be composed of fused silica for example, in thin films of a preset thickness (a few tens of nanometers up to micrometers). What has proved to be a suitable process for applying the coating is plasma polymerization, with the help of which a film of PP-OFCB can be deposited on the front face in a deposit of a very precisely controllable thickness. Plasma polymerization is already familiar from what is known as the Bosch process and is used in DRIE (deep reactive ion etching) processes which are used to produce deep microstructures. Details of the procedure for plasma polymerizing OFCB are explained in, for example, the publication "Hydrophobic valves of plasma deposited octafluorocyclobutanate in DRIE channels," H. Andersson et al., Sensors and Actuators (2001), pp. 136ff and are incorporated by reference in the present disclosure.

A film of PP-OFCB has a refractive index of approximately n=1.4, which does not necessarily correspond to the refractive index of the material of the waveguide. With a view to a good match of refractive indices, it has been found advantageous for there to be added to the coating a further substance, having a different refractive index, which can preferably likewise be applied or deposited by plasma polymerization.

The coating preferably comprises benzene ($C_6H_6$) and/or products of the polymerization of benzene and in particular plasma polymerized benzene (PP-benzene). A film of PP-benzene has satisfactory optical properties and in particular good transmission properties in the relevant optical ranges, and can likewise be applied to the front face by plasma polymerization. A film of PP-benzene has a refractive index of approximately n=1.62.

The refractive index of the coating can be matched to the refractive index of the material of the waveguide by giving the coating a layer of PP-OFCB and PP-benzene mixed in a preset ratio. PP-OFCB and PP-benzene are preferably applied to the front face of the waveguide simultaneously in a plasma polymerization step, in which case refractive indices of between n=1.4 and n=1.62 can be set for the coating as dictated by the mixing ratio set for the process.

If the waveguide comprises fused silica, a refractive index for the coating approximately n=1.45 has proved particularly useful.

Alternatively or in addition, the coating may have a plurality of layers in a preset sequence. By alternating layers of PP-OFCB and PP-benzene by sequential polymerization of $C_4F_8$ and $C_6H_6$, it is for example possible to provide anti-reflection films, filter films and/or films of a special color, as a result of an increase in reflection and/or transmission in certain wavelength ranges.

In accordance with a particularly important aspect of the invention, the front face of the waveguide and/or the outer face of the coating are structured and/or roughened. By such a structuring (or roughening in the pin or nm range), the hydrophobic and/or oleophobic properties of the surface can be further improved due to the increase in surface area related to the roughening.

This improvement in the oleophobic and hydrophobic action due to the structuring is particularly good when the outer surface of the coating which is regularly exposed to the environment is structured.

On the one hand the adhesive properties of the coating to the front face of the waveguide can be improved by structuring said front face before it is coated. On the other hand, the structuring may carry through as far as the outer surface of the coating, at least in the case of a thin coating of a thickness in the nanometer range, thus enabling the improved oleophobic and hydrophobic action which has been described to be achieved in this case too if required.

Something which has proved particularly advantageous in view of a fouling-repellent action is for the front face of the waveguide and/or the outer face of the coating to be treated with plasma, and in particular to be treated with oxygen plasma, to form structuring of a depth of between 1 nm and 100 nm, and in particular of between 1 nm and 10 nm.

The plasma etching step such as treatment with oxygen plasma may be performed before and/or after the coating step, in which case a plasma etching step before the coating step is able, in addition, to improve the resistance of the coating to abrasion from the front face and hence the mechanical properties of the coated front face.

The front face is preferably a facet of an optical fiber and/or part of an insertion-type light guide connector.

In accordance with a further aspect, the invention relates to a method of producing a waveguide according to the invention such as an optical fiber, in which the front face of the waveguide is coated with a coating comprising an organic fluorine compound by plasma polymerization, using OFCB as a precursor.

Preferably, in the plasma polymerization, OFCB and benzene are used simultaneously or alternately as precursors, the front face thus being coated with PP-OFCB and PP-benzene simultaneously or alternately.

By an alternating coating operation using OFCB and benzene as precursors, there is formed on the front face an alternating sequence of layers which may be intended as an AR-coating and/or to give a particular coloring.

The refractive index of the coating can be matched to that of the material of the waveguide by applying a mixed layer of two types of plasma polymers (PP-OFCB and PP-benzene) having differing refractive indices.

Alternatively or in addition, the front face of the waveguide is roughened before and/or after the coating step, preferably by means of a plasma and/or etching treatment such as treatment with an oxygen plasma. Attention is directed to the statements and explanations given above.

In the description which now follows, the invention will be explained by reference to the accompanying drawings.

Figure 2:
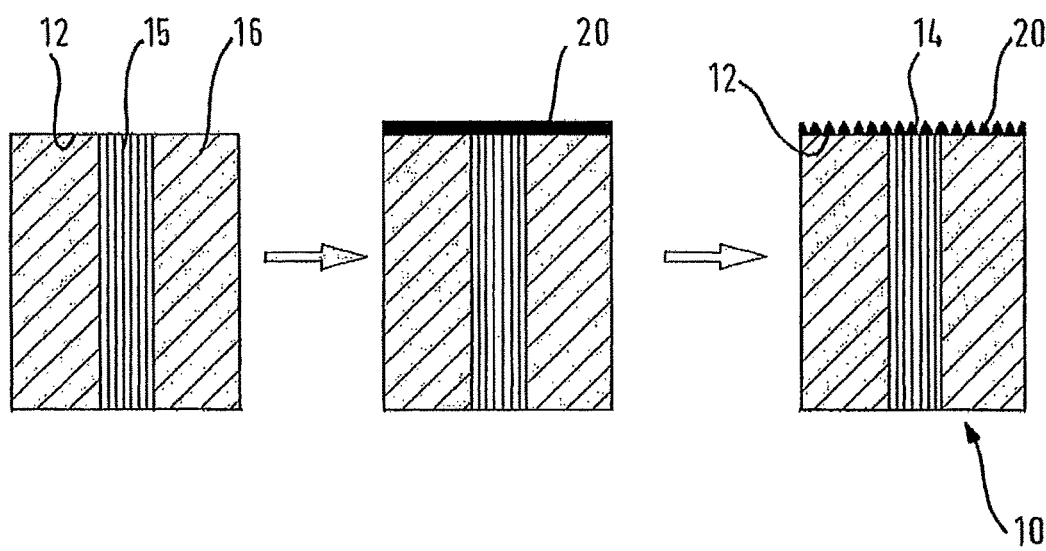
FIG. 2 shows, in schematic views, a variant method of producing a waveguide according to the invention in three steps.

In each of FIGS. 1 and 2, a waveguide 10 in the form of an optical fiber such as a glass fiber is shown in the view on the left before the coating of the waveguide. The waveguide 10 has a signal-carrying core 15 and a cladding 16 which surrounds the signal-carrying core 15 co-axially. Via a front face 12 of the waveguide 10, light is able to enter the signal-carrying core 15 of the fiber and/or to emerge from the signal-carrying core 15 when the waveguide is in use. In other words, in the example shown the front face is a fiber facet extending transversely to the longitudinal direction of the fiber.

In the method of production shown in FIG. 1, this front face is first roughened or structured (see the view in the center). For this purpose, the front face 12 may be treated with oxygen plasma whereby, as a function of the parameters set for the method, there is produced on the front face 12 etching-generated grass giving a roughening of a depth in the nm range of up to several hundred nm or more.

The structuring 14 is then coated by plasma polymerization using OFCB as a precursor comprising organic fluorine compounds (see the view on the right). The thickness of the PP-OFCB coating 20 may be selected in such a way that the structuring 14 previously incorporated in the fiber front face 12 is still present on the outer surface of the coating (possible with the depth of the structuring and the contouring of the structuring reduced) even after the coating operation. Advantageously, but not obligatorily, the thickness of the coating film is less than the depth of the structuring for this purpose. The oleophobic and hydrophobic properties of the coated front face can be further improved by the roughening present on the outer face of the coating 20.

As well as PP-OFCB, the coating 20 may also comprise PP-benzene, in which case the PP-benzene may be applied by plasma polymerization alternately or simultaneously with the PP-OFCB.

In the alternative method of production which is shown in FIG. 2, the substantially flat front face 12 of the waveguide 10 is first coated by plasma polymerization using OFCB as a precursor (see the view in the center). As well as PP-OFCB, the coating 20 may also comprise PP-benzene, in which case the benzene may be applied by plasma polymerization alternately or simultaneously with the OFCB.

The flat outer face of the coating 20 is then roughened. Just as in the method of production shown in FIG. 1, the roughening may be performed by treatment with a plasma such as treatment with an oxygen plasma.

In the examples shown, it is the entire front face of the waveguide which is coated and roughened in each case. It is also possible for only a sub-region of the front face, such as a central region, to be coating and, if required, roughened. Equally possible is coating without any prior and/or subsequent roughening. As dictated by the material of the waveguide, benzene and OFCB can be used in the polymerization mixed in an appropriate ratio in order to achieve a matching of refractive indices.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An optical waveguide having a front face provided with a coating, the coating comprising one or more organic fluorine compounds, wherein the front face of the optical waveguide is treated with plasma whereby there is produced on the front face etching-generated grass.

2. The optical waveguide of claim 1, wherein the coating comprises octafluorocyclobutane (OFCB) and/or products of the polymerization of OFCB.

3. The optical waveguide of claim 2 wherein said coating comprises plasma polymerized OFCB (PP-OFCB).

4. The optical waveguide of claim 1, wherein the coating also comprises benzene and/or products of the polymerization of benzene.

5. The optical waveguide of claim 4, wherein the coating comprises a layer of PP-OFCB and PP-benzene mixed in a preset ratio.

6. The optical waveguide of claim 5, wherein the mixing ratio is set in such a way that the refractive index of the layer is matched to the refractive index of a material of the waveguide, the refractive index of the layer being approximately n=1.45.

7. The optical waveguide of claim 4 wherein the coating comprises plasma polymerized benzene (PP-benzene).

8. The optical waveguide of claim 5, wherein the coating comprises alternating layers of plasma polymerized OFCB (PP-OFCB) and plasma polymerized benzene (PP-benzene).

9. The optical waveguide of claim 8 wherein the front face of the optical waveguide and/or the outer face of the coating is structured to a depth of between 1 nm and 10 nm.

10. The optical waveguide of claim 1, wherein the coating comprises alternating layers of plasma polymerized OFCB (PP-OFCB) and plasma polymerized benzene (PP-benzene).

11. The optical waveguide of claim 1 wherein the front face of the optical waveguide and/or the outer face of the coating is structured to a depth of between 1 nm and 100 nm.

12. The optical waveguide of claim 11 wherein structuring said front face of the optical waveguide and/or the outer face of the coating is treated with plasma or an oxygen plasma.

13. The optical waveguide of claim 1 wherein the front face is a fiber facet.

14. The optical waveguide of claim 1 wherein said optical waveguide includes at least one optical fiber.

15. The optical waveguide of claim 14 wherein the front face is a fiber facet.

16. A method of producing a waveguide having a front face, said method comprising:
coating said front face with a coating comprising organic fluorine compounds by plasma polymerization, using OFCB as a precursor; and
structuring the front face of the waveguide by plasma whereby there is produced on the front face etching-generated grass.

17. The method of claim 16, wherein, in the plasma polymerization, OFCB and benzene are used simultaneously or alternately as precursors, the front face thus being coated with plasma polymerized OFCB (PP-OFCB) and plasma polymerized benzene (PP-benzene) simultaneously or alternately.

18. The method of claim 17, wherein the front face of the waveguide and/or the outer face of the coating is structured, by treatment with an oxygen plasma.

19. The method of claim 16, wherein the front face of the waveguide and/or the outer face of the coating is structured by treatment with an oxygen plasma.

* * * * *

UNITED STATES PATENT AND TRADEMARK OFFICE
CERTIFICATE OF CORRECTION

PATENT NO. : 10,139,565 B2
APPLICATION NO. : 15/315910
DATED : November 27, 2018
INVENTOR(S) : Johannes Albert L'Huillier, Benjamin Weigand and Christian Theobald It is certified that error appears in the above-identified patent and that said Letters Patent is hereby corrected as shown below:

In the Specification

Column 4, Line 11 delete "pin" and substitute therefore --µm--

Signed and Sealed this
Sixteenth Day of April, 2019

Andrei Iancu
*Director of the United States Patent and Trademark Office*